United States Patent [19]

Yu et al.

[11] Patent Number: 4,800,298

[45] Date of Patent: Jan. 24, 1989

[54] OUTPUT BUFFER FOR IMPROVING DI/DT

[75] Inventors: Ruey J. Yu; Alan R. Bormann, both of Austin, Tex.

[73] Assignee: Motorola, Inc., Schaumberg, Ill.

[21] Appl. No.: 81,194

[22] Filed: Aug. 4, 1987

[51] Int. Cl.[4] .................... H03K 17/04; H03K 17/12; H03K 17/284; H03K 17/687

[52] U.S. Cl. ..................... 307/443; 307/246; 307/451; 307/270; 307/548; 307/296 R

[58] Field of Search .............. 307/443, 52, 85, 448, 307/450, 451, 544, 546, 548, 554, 555, 568, 246, 571, 576, 579, 585, 270, 592, 594, 304, 296.8, 542.1

[56] References Cited

U.S. PATENT DOCUMENTS

| | | | |
|---|---|---|---|
| 4,567,378 | 1/1986 | Raver | 307/443 X |
| 4,609,834 | 9/1986 | Gal | 307/443 |
| 4,612,466 | 9/1986 | Stewart | 307/443 X |
| 4,613,771 | 9/1986 | Gal | 307/443 |
| 4,622,482 | 11/1986 | Ganger | 307/585 |
| 4,626,715 | 12/1986 | Ishii | 307/585 |
| 4,638,187 | 1/1987 | Boler et al. | 307/443 X |
| 4,758,743 | 7/1988 | Dehganpour et al. | 307/443 |

Primary Examiner—Stanley D. Miller
Assistant Examiner—David R. Bertelson
Attorney, Agent, or Firm—James L. Clingan, Jr.

[57] ABSTRACT

An integrated circuit comprises a chip containing electric circuits in a package with leads. The chip receives power via the leads. The leads have inductance so that when there is a change in current flow (di/dt) through a lead there is a voltage which is developed between the ends of the lead and the chip which can cause the chip to either malfunction or function poorly. The highest di/dt is generally by an output buffer that changes the logic state of its output. The typical output buffer has a pair of driver transistors that provide one of a logic high or logic low. The di/dt generated by these transistors in controlled by controlling the voltage on the gate of the transistor which is providing the particular logic state. This control reduces di/dt from that typically provided at the very beginning of a logic state transition but increases it over that typically provided immediately thereafter for the purpose of optimizing logic state transition speed for a given maximum di/dt. The control of the gate of the driver transistor is modulated by the output voltage itself.

14 Claims, 2 Drawing Sheets

OUTPUT BUFFER FOR IMPROVING DI/DT

FIELD OF THE INVENTION

The present invention relates to buffers, and more particularly, to buffers which have inductance between a power source and the buffer.

BACKGROUND OF THE INVENTION

In integrated circuits, there is generally a piece of silicon known as a die or chip which contains electrical circuits and which is connected to a lead frame. The chip has bonding pads which are connected to the lead frame by tiny wires. The lead frame has leads which are used for connecting to a printed circuit board as part of a larger system. The leads of the lead frame have a certain amount of inductance as well as capacitance and resistance. There is also some inductance in the wire from the bonding pad to the lead frame. This wire inductance, however, is significantly less than that of the lead frame. The connection of a lead of the lead frame to a circuit board also adds some inductance. As the switching speeds of integrated circuits have increased, this cumulative inductance has begun to have an impact on the performance of the integrated circuit.

Of course it is desirable to have integrated circuits which are very fast. The increased switching speed has also increased the rate at which current changes. This increased rate of current change causes a voltage drop across the inductance. The voltage across an inductance is equal to the inductance times the time rate of change of the current through that inductance. This is expressed as Ldi/dt, where L is the inductance and di/dt is the time rate of change of the current. As the di/dt becomes larger, the voltage across the inductance becomes larger. This voltage drop across an inductance causes a voltage differential between the lead location on the circuit board and the bonding pad to which it is connected on the integrated circuit. This can create a problem of having the internal supply at different voltage than the voltage of the external supply.

This problem can be described by reference to FIG. 1 which shows a portion of an integrated circuit comprised of an output buffer 11, an internal positive power supply terminal VCCin connected to an external positive power supply terminal VCCex, an internal negative power supply terminal VSSin connected to an external negative power supply terminal VSSex, an internal output terminal Qin connected to an external output terminal Qex. Output buffer 11 is receives power from its connections to VCCin and VSSin. In typical currently used integrated circuits, VCC is nominally 5 volts. Output buffer 11 provides an output on Qin. VCCin is an internal bonding pad on the chip portion of the integrated circuit. VCCex is the tip of one of the leads of the lead frame portion of integrated circuit 10. VSSin is an internal bonding pad on the chip portion of integrated circuit 10. VSSex is the tip of one of the leads of the lead frame portion of integrated circuit 10. Qin is an internal bonding pad on the chip portion of integrated circuit 10. Qex is the tip of one of the leads of the lead frame portion of integrated circuit 10. Inductances indicated as L1, L2, and L represent the inductances present by virtue of the connections between VCCin and VCCex, VSSin and VSSex, and Qin and Qex, respectively.

When output buffer 11 switches logic states, there will be a change in the current flowing into or out of input buffer with respect to Qin. The amount of the current flowing will depend at least somewhat on a load which will be present on Qex. If the current changes so that more current is flowing to Qin, there will also be more current flowing from VCCin to output buffer 11 which in turn means that more current will be flowing between VCCex and VCCin. This change in current flow will cause a voltage drop between VCCin and VCCex by virtue of inductance L1. This voltage drop will be proportional to how rapidly the current changes between VCCin and VCCex. The expression for this voltage drop is L1di/dt. The L1di/dt voltage drop is thus the difference between the power supply voltage which is present on the circuit board and the internal power supply which is used to drive the internal circuitry of integrated circuit 10. If this L1di/dt becomes sufficiently large, the logic state of other inputs to integrated circuit 10 can be misinterpreted. What the external circuit board interprets as a logic low may be interpreted as a logic high by integrated circuit 10 because the internal power supply voltage is so low. Although this differential between internal and external power supply voltage is only for the duration of the high rate of change of current, this can result in providing an erroneous output in an integrated circuit that is externally clocked or a significant delay in providing a valid output in an integrated circuit that is static.

The same type of situation can occur for the case in which output buffer 11 begins sinking current from Qin. In such case there will be a current change between output buffer 11 and VSSin which will also be present between VSSin and VSSex. The consequent change in current flow through L3 will cause a voltage drop between the internal VSSin and the external VSSex. This will have the affect of raising the voltage of the internal ground (VSS) above that of the circuit board ground. If this voltage differential becomes sufficiently large, then inputs to integrated circuit 10 may be misinterpreted. A signal which is a logic high with respect to the circuit board which is using VSSex as the ground reference, may be interpreted by integrated circuit 10 as a logic low because VSSex is too high of a voltage. This is in fact in general the more severe problem because in general a logic high is guaranteed as being recognized as a logic high which is below one half of the power supply voltage. For example, in a typical 5-volt power supply MOS circuit, it is guaranteed that a signal will be recognized as a logic high even if it is only 2.0 volts. Such an input will then be more susceptible to making a false detection when there are fluctuations in an internal ground than when there are fluctuations in the internal 5-volt power supply terminal.

One conventional solution has been to keep the device sizes of the output buffer sufficiently low so that the output buffer does not cause too large of a current change. This of course is a sacrifice of speed. Another solution has been to add more power supply leads so that the current change is spread over more leads. More leads can viewed as placing inductors in parallel which decreases the inductance. This adds to the cost of the package as well as requiring more space on the circuit board. Another approach has been to precharge the output to a logic low prior to valid data appearing on the output. This takes advantage of the more severe problem occurring during a logic high to logic low transition. It is, however, generally desirable for the output to be high impedance (commonly known as tri-stated) when it is not valid. An example of this approach is shown in U.S. Pat. No. 4,661,928, Yasuoka.

The typical di/dt response to a typical logic state transition of a MOS type output is shown in FIG. 2. Shown in FIG. 2 is the logic low to logic high case. The transition begins at time t0 and is complete at a time t1. The resulting change in current is shown as di/dt. A positive spike begins at time t0 when the current is increasing most rapidly. The rate of change of current falls off rapidly and becomes negative. The current is stabilized at time t1. The maximum height of the di/dt spike causes the maximum voltage differential between the internal power supply and the external power supply. Another solution is to provide a second pull-down device in the output buffer which is driven from an RC delayed signal so that there is somewhat of a stagger effect in changing the current flow. This results in two di/dt spikes so that the maximum spike height is lowered. This is an improvement but still not optimum. The problem has been most frequently seen in output buffers but internal buffers can have the same problem if there is a large current change. One example is the simultaneous precharging of the bit lines of a memory.

Shown in FIG. 3 is a desired shape of the time rate of change of the current drawn by a buffer, particularly for buffers which cause a large current change, such as an output buffer or a driver for precharging bit lines. To achieve a logic state change, there is some amount of charge which must be transferred. There is a steady state charge flow, or current, which must be sustained after the logic state has been changed. There is also capacitance which must be charged as part of the logic state change. Assuming that a logic state change is to be completed within the time from t0 to t1, the optimum di/dt curve is shown in FIG. 3. The rate of current change will be zero until time t0. At time t0, di/dt will reach a certain value and remain at that level until about half way through the logic state change. At that point the current needs to decrease to the steady state condition. This decrease should also occur at a constant rate until time t1. Although the negative portion of di/dt can potentially be as significant of a problem as the positive side, this is not generally the case. The nature of the circuitry generally causes slow changes as the steady state condition is approached. The nature of MOS transistors is such that when they are in the triode region, the current is proportional to the drain to source voltage. As the transistor that is charging an output node has its drain and source connected between a power supply terminal and the output node so that as the node becomes charged, the drain to source voltage decreases so that the current is reduced. There is thus in the nature of output transistors a relatively smooth di/dt reduction. Also the new logic state is actually reached before the steady state condition is reached. For example, a buffer may provide a logic high at a steady state of 5 volts but a logic high is certain to be recognized when 4 volts is reached. In such case the rate at which the output moves from 4 volts to 5 volts is not significant. Consequently, the di/dt reduction is not generally a major consideration. The objective then is to reach the level at which a logic high is certain to be detected as fast as possible without causing a di/dt which is too great. A constant di/dt is thus the goal for at least the first half of the logic state transition. An improvement over the performance shown in FIG. 2 was disclosed in U.S. patent application No. 911,702, Dehganpour et al, filed Sept. 26, 1986, and assigned to the assignee hereof. The present invention is a further improvement to the invention disclosed in that application.

SUMMARY OF THE INVENTION

An object of the present invention is to provide an improved output buffer.

Another object of the invention is to provide an output buffer with improved di/dt performance.

Yet another object of the invention is to provide an integrated circuit with improved output performance.

These and other objects are achieved in an integrated circuit comprising a chip containing electrical circuits contained in a package having leads, wherein a first lead is connected to a first power supply terminal of the chip, a second lead is connected to a second power supply terminal of the chip, and a third lead is connected to an output terminal of the chip, the first and second leads characterized as having inductance. A buffer circuit in the chip comprises a driver circuit, a sensing circuit, and a control circuit. The driver circuit is coupled to the output terminal and has an input. The driver circuit passes current between the first power supply terminal and the output terminal in proportion to a voltage level on said input in order to change a voltage level on said output terminal. The sensing circuit is coupled to the output terminal and provides a sense signal at a voltage representative of the voltage on the output terminal. The control circuit has a first input for receiving a data signal and a second input for receiving the sense signal. The control circuit provides the voltage to the input of the driver means, in response to receiving the data signal, at a rate of change modulated by the voltage of the sense signal.

DESCRIPTION OF THE INVENTION

Figure 4:
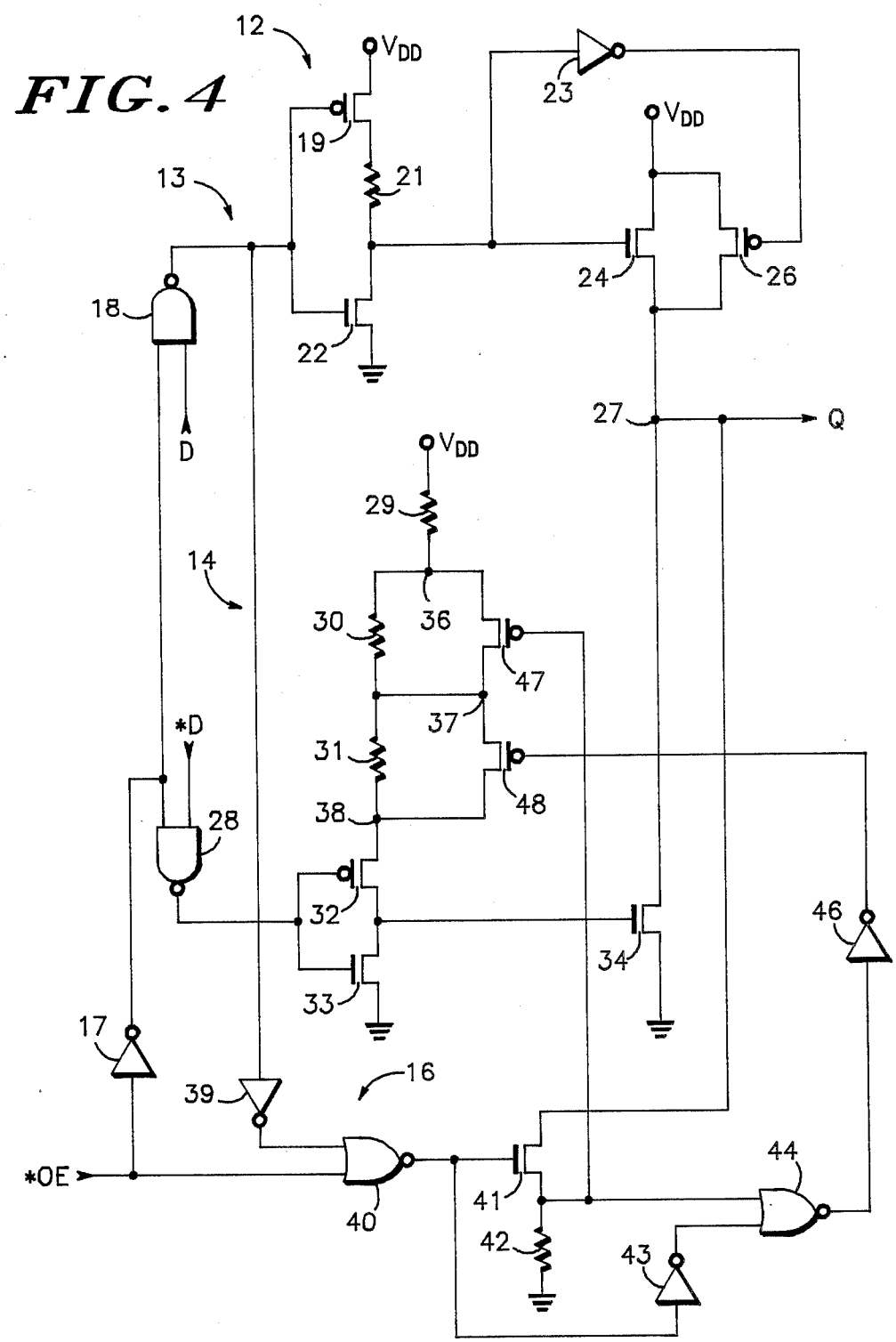
FIG. 4 is circuit diagram of an output buffer according to a preferred embodiment of the invention.

Shown in FIG. 4 is an output buffer 12 for use in providing an output signal of an integrated circuit comprised generally of a logic high driver 13, a logic low driver 14, a di/dt control circuit 16, and an inverter 17. Inverter 17 has an input for receiving an output enable signal *OE and an output. Output enable signal is a active low signal as indicated by the asterisk (*). Logic high driver 13 is comprised of a NAND gate 18, a P channel transistor 19, a resistor 21, an N channel transistor 22, an inverter 23, an N channel transistor 24, and a P channel transistor 26. NAND gate 18 has a first input for receiving a data signal D, a second input connected to the output of inverter 17, and an output. P channel transistor 19 has a source connected to a positive power supply terminal VDD for receiving, for example, 5 volts, a gate connected to the output of NAND gate 18, and a drain. Resistor 21 has a first terminal connected to the drain of transistor 19, and a second terminal. Transistor 19 and resistor 21 are coupled in series between VDD and transistor 24. Which one is connected to VDD is not particularly significant. Transistor 22 has a drain connected to the second terminal of resistor 21, a gate connected to the output of NAND gate 18, and a source connected to a negative power supply terminal, shown as ground. Inverter 23 has an input connected to the drain of transistor 22 and an output. Transistor 24 has a gate connected to the drain of transistor 22, a drain connected to VDD, and a source connected to an output node 27 at which is provided output signal Q which is the output signal of buffer 12. Transistor 26 has a source connected to VDD, a gate connected to the output of inverter 23, and a drain connected to node 27.

Logic low driver 14 is comprised of a NAND gate 28, a resistor 29, a resistor 30, a resistor 31, a P channel transistor 32, an N channel transistor 33, and an N channel 34. NAND gate 28 has a first input for receiving complementary data signal *D, a second input connected to the output of inverter 17, and an output. Resistor 29 has a first terminal connected to VDD and a second terminal connected to a node 36. Resistor 30 has a first terminal connected to node 36 and a second terminal connected to a node 37. Resistor 31 has a first terminal connected to node 37 and second terminal connected to a node 38. Transistor 32 has a source connected to node 38, a gate connected to the output of NAND gate 28, and a drain. Transistor 33 has a drain connected to the drain of transistor 32, a gate connected to the output of NAND gate 28, and a source connected to ground. Transistor 34 has a gate connected to the drain of transistor 33, a drain connected to node 27, and a source connected to ground.

Control circuit 16 is comprised generally of an inverter 39, a NOR gate 40, an N channel transistor 41, a resistor 42, an inverter 43, a NOR gate 44, an inverter 46, a P channel transistor 47, and a P channel transistor 48. Inverter 39 has an input connected to the output of NAND gate 18, and an output. NOR gate 40 has a first input connected to the output of inverter 39, a second input for receiving output enable signal *OE, and an output. Transistor 41 has a gate connected to the output of NOR gate 40, a drain connected to node 27, and a source. Resistor 42 has a first terminal connected to the source of transistor 41, and a second terminal connected ground. Inverter 43 has an input connected to the output of NOR gate 40, and an output. NOR gate 44 has a first input connected to the output of inverter 43, a second input connected to the source of transistor 41, and an output. Inverter 46 has an input connected to the output of NOR gate 44, and an output. Transistor 47 has a source connected to node 36, a drain connected to node 37, and a gate connected to the source of transistor 41. Transistor 48 has a source connected to node 37, a drain connected to node 38, and a gate connected to the output of inverter 46.

Output buffer 12 provides signal Q at a logic state representative of data signals D and *D for the case in which output enable signal is active which is a logic low. Output enable signal *OE at a logic high ensures that buffer 12 is tri-stated so that signal Q is high impedance. For the tri-state case, inverter 17 provides a logic low output to NAND gates 18 and 28 which forces NAND gates 18 and 28 to provide logic high outputs. The logic high output of NAND gate 18 causes N channel transistor 22 to be conductive and P channel transistor 19 to be non-conductive so that the gate of transistor 24 and the input of inverter 23 are held to a logic low. This causes transistor 24 to be non-conductive and inverter 23 to provide a logic high output which causes transistor 26 to be non-conductive. Thus, when the output of NAND gate 18 is a logic high, transistors 24 and 26 will be non-conductive add logic high driver 13 will not provide current to node 27. NAND gate 28 providing a logic high output causes transistor 32 to be non-conductive and transistor 33 to be conductive which causes the gate of transistor 34 to be at a logic low which in turn causes transistor 34 to be non-conductive Thus logic low driver 14 provides a non-conductive output when the output of NAND gate 28 is a logic high. Output enable signal at a logic high also forces NOR gate 40 to a particular logic state which is a logic low output. The logic low output of NOR gate 40 causes transistor 41 to be non-conductive. Thus, buffer 12 provides no path to either power supply terminal when signal *OE is a logic high.

As used herein, signal *OE is logical combination of signals. One signal is an externally provided chip enable signal. If the externally provided chip enable signal is inactive, then signal *OE will also be inactive and output buffer 12 will be tri-stated Another signal is an internal signal which indicates that the data being provided is valid. To ensure that there is no unnecessary delay in providing signal Q, the internal signal is generated slightly before internal data signals D and *D are fully developed. Signal *OE is inhibited from becoming active until the internal signal has been generated. Thus, signal *OE becomes active in response to one of these signals when the other one of these is already active.

When signal *OE is a logic low, NAND gates 18 and 28 are responsive to signals D and *D, respectively. If signal D is a logic low, the output of NAND gate is a logic high which causes logic high driver 13 to provide no path to VDD. Similarly, if signal *D is a logic low, NAND gate 28 outputs a logic high which causes logic low driver 14 to provide no path to ground. If signal D is a logic high, then output buffer is to provide signal Q at a logic high. This is achieved by logic high driver 13. Signal D at a logic high causes NAND gate 18 to output a logic low. This logic low causes transistor 22 become non-conductive and transistor 19 to be conductive. This causes a logic high on the gate of transistor 24 and the input of inverter 23. The logic high on the gate of transistor 24 causes transistor 24 to be conductive. The logic high on the input of inverter 23 causes inverter 23 to provide a logic low output which causes transistor 26 to be conductive With transistors 24 and 26 conductive, signal Q is driven to a logic high which can rise to the voltage at VDD. The operation of inverter 23 and transistors 24 and 26 is very common for a CMOS output buffer. Resistor 21 provides for improved di/dt performance over decreasing the P channel gain. Sufficiently decreasing the P channel gain can sufficiently reduce the di/dt peak but also provides too much current limiting after the initial peak so that speed is sacrificed. Using resistor 21 was effective in reducing the peak di/dt while not having as much slowing effect. The magnitude of the peak di/dt was found to be related, inversely, to the resistance of resistor 21, whereas speed of the circuit was found to be directly related to the resistance of resistor 21. Thus, there was still a speed versus peak di/dt tradeoff although improved over reducing the gain of P channel transistor 19. For the logic low to logic high transition, a higher peak di/dt could be tolerated. Consequently, resistor 21 could be of sufficiently low resistance for high speed while also providing sufficient peak di/dt protection.

When data signal *D is a logic high there can then be the more sensitive logic high to logic low transition of signal Q. For the case when signal *D is a logic high, NAND gate 28 will provide a logic low output which will cause transistor 33 to be non-conductive and transistor 32 to be conductive. A logic high will then be coupled to the gate of transistor 34 via a combination of resistors 29-31 and transistors 47 and 48. With the gate of transistor 34 at a logic high, transistor 34 will be conductive causing signal Q to be a logic low. Prior to transistor 34 being conductive, buffer 12 is tri-stated. In the tri-state condition, the voltage on node 27 can easily be the positive power supply voltage. The output of buffer 12 is just one of many possible circuits which may be coupled to a common bus. This common bus can thus be at any number of possible voltages at the time that the output buffer outputs signal Q onto it. Thus buffer 12 must be designed to be able to operate reliably for the case when node 27 is at a logic high of the power supply voltage.

Control circuit 16 is used to provide di/dt control for the logic high to logic low transition condition of signal Q. Transistor 41 and resistor 42 are used to provide information as to the status of the voltage on node 27. This information is used to modulate the resistance between nodes 36 and 37 and between nodes 37 and 38. Conductivity of transistors 47 and 48 is thus controlled by the voltage on node 27 for the case in which signal Q is to be provided at a logic low. Control circuit 16 is responsive to the output of NAND gate 18, signal *OE, and the voltage on node 27. During tri-state conditions when signal *OE is a logic high, the output of NAND gate 18 is a logic high which causes inverter 39 to output a logic low to NOR gate 40. NOR gate 40 is forced to provide a logic low output by output enable signal *OE being a logic high. The logic low output of NOR gate 40 causes transistor 41 to be non-conductive. With transistor 41 non-conductive, there will be no current through resistor 42 so that the source of transistor 41 will be a logic low. The logic low output of NOR gate 40 causes inverter 43 to output a logic high to NOR gate 44 which in turn forces NOR gate 44 to provide a logic low to inverter 46 which in turn outputs a logic high. The logic low output of the source of transistor 41 causes transistor 47 to be conductive. This is not significant because transistor 32 is non-conductive when signal *OE is a logic high. The logic high output of inverter 46 causes transistor 48 to be non-conductive.

Figure 1:
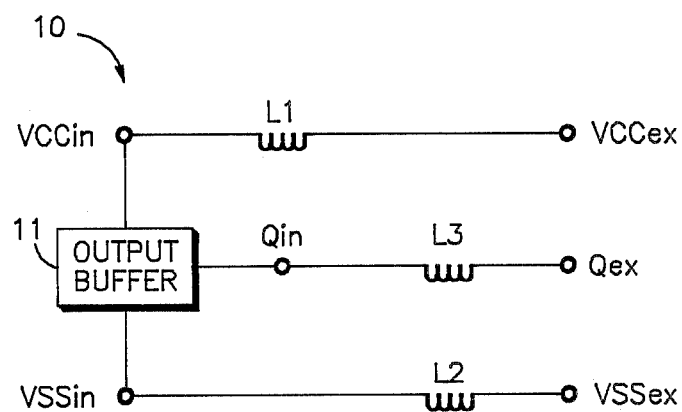
FIG. 1 is a combination circuit diagram and block diagram of a portion of an integrated circuit according to the prior art.
Figure 2:
FIG. 2 is a diagram of a typical shape of time rate of change of current supplied by a buffer of the prior art.
Figure 3:
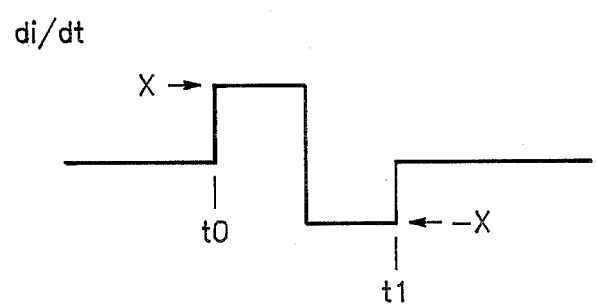
FIG. 3 is a diagram of a desired shape of time rate of change of current supplied by a buffer.

Assume then that node 27 is effectively precharged to VDD when there is to be a logic low output from buffer 12. Signals D and *D are preset to a logic low prior to representing valid data. Just prior to signal *D switching to a logic high, which occurs for the present case of signal Q switching to a logic low, signal *OE switches to a logic low. NOR gate 40 responds by outputting a logic high to transistor 41 which then couples the voltage on node 27 to the gate of transistor 47. Transistor 47 is then either marginally conductive or not conductive at all. This has the effect of the resistance between node 36 and 37 being essentially the resistance of resistor 30. Inverter 43 responds by providing a logic low output to NOR gate 44 which causes NOR gate 44 to be responsive to the voltage on the source of transistor 41. Due to the gain of two stages, NOR gate 44 and inverter 46, between the source of transistor 41 and the gate of transistor 48, transistor 48 is either fully conductive or is non-conductive With transistor 48 beginning in the non-conductive state, the resistance between node 37 and node 38 is the same as the resistance of resistor 31. When signal *D switches to a logic high, NAND gate 28 responds by providing a logic low output which causes transistor 32 to become conductive and transistor 33 to become non-conductive. The drains of transistors 32 and 33 then begin rising in voltage which causes transistor 34 to begin conducting. The rate that transistor 34 increases in conductivity is influenced by resistors 29-31. As transistor 34 begins causing the voltage on node 27 to drop, the voltage on the source of transistor 41 also begins to drop which in turn increases the conductivity of transistor 47 which in turn increases the conductivity between node 36 and 37 which in turn increases the rate that the voltage on the gate of transistor 34 rises. As the voltage on node 27 drops far enough that the input to NOR gate 44 recogizes it as a logic low, NOR gate 44 will provide a logic high output to inverter 46 which will in turn provide a logic low to transistor 48 which responds by becoming fully conductive. With transistor 47 conductive and transistor 48 conductive, only resistor 29 is retarding the increase in voltage on the gate of transistor 34. Thus at the very onset of a logic high to logic low transition, there is maximum resistance in the P channel path to transistor 34. As shown in FIG. 2, a short time after the beginning of the logic state transition is the time of the natural peak in di/dt. It is at this time that the resistance is at its peak providing the maximum restraint on peak di/dt. As the logic state transition progresses, the resistance is decreased so that current can continue to increase at a rate closer to the peak di/dt than that provided by fixed resistance. The resistance in the P channel path, and thus the rate at which the voltage on the gate of transistor 34 increases, is modulated by the output voltage. Because the current which passes through transistor 34 is proportional to the voltage on its gate, di/dt between node 27 and ground is effectively modulated as a function of the voltage on node 27. The maximum resistance is provided if the initial voltage on node 27 is at a maximum voltage. If, for example, the voltage on node 27 is intermediate VDD and ground, the voltage on the source of transistor 41 would reflect that fact so that transistor 47 would begin in a more conductive condition than if node 27 was initially at VDD. The voltage applied to transistor 47 via transistor 41 is an N channel threshold voltage below the voltage on node 27. This is advantageous for providing compensation for process variations.

One of the variables in a process is threshold voltage. Devices which are produced when the process varies to cause lower threshold voltages results in a device which is faster. This is generally good but it also causes a more sever di/dt problem. In such a case, the threshold voltage of transistor 41 will also be lower so that more of the voltage on node 27 is coupled to transistor 47 so that more di/dt damping is obtained. The same is true over temperature. Lower temperatures result in faster operation through higher transistor conductivity. The higher transistor conductivity applies to transistor 41 as well as the other transistors so that again in the situation in which the problem is greater, the compensation is also greater.

For the case in which data signals D and *D are already developed and output buffer 12 is waiting for an external signal to cause signal *OE to become active, P channel transistors still provide the desired compensation in sufficient time to modulate the natural di/dt peak. Inverter 17 provides an extra delay stage for logic low driver 14. Additionally, transistors 47 and 48 do not need to be modulating immediately at the onset of the logic transition because the natural peak is not immediately at the onset. For a small inverter or logic gate that is driving a small load, the switching time is about a fourth of a nanosecond whereas the fall time of signal Q should be about one and a half nanoseconds. NOR gate 40 and transistor 41, as well as inverter 43 and NOR gate 44, have very little load to drive whereas transistor 34 is quite large and provides a substantial load to transistors 32 and 33.

The output of NAND gate 18 is connected to control circuit 16 to perform a disable function for the case in which buffer 12 is to provide a logic high output. In such a case signal D will switch to a logic but NOR gate 40 will have already enabled transistor 41 which in turn couples the node 27 voltage to P channel transistor 47. This action of P channel transistor 47 is of no consequence because transistor 32 is held non-conductive by NAND gate 28 being held to a logic high. Transistor 41 does, however, provide a path to ground via resistor 42. In response to signal D switching to a logic high, NAND gate 18 provides a logic low output to inverter 39 which outputs a logic high to NOR gate 40 which in turn outputs a logic low to transistor 41 which causes transistor 41 to become non-conductive. The small amount of time that transistor 41 is conductive affects node 27 only slightly because of the small gain of transistor 41 and high resistance of resistor 42. The logic low output of NAND gate 18 then, via transistor 19, causes transistors 24 and 26 to be conductive and provide signal Q at a logic high.

While the invention has been described in a particular embodiment it will be apparent to those skilled in the art that the disclosed invention may be modified in numerous ways and may assume many embodiments other than that specifically set out and described above. For example, the type of di/dt compensation applied to logic low driver 14 could also be applied to logic high driver 13. Accordingly, it is intended by the appended claims to cover all modifications of the invention which fall within the true spirit and scope of the invention.

We claim:

1. A buffer circuit comprising:
    driver means, coupled to an output terminal and having an input, for passing current between a first power supply terminal and the output terminal in proportion to a voltage level on said first input in order to change a voltage level on said output terminal;
    a first transistor and a first resistor, and a second resistor coupled in series between a second power supply terminal and the input of the driver means, said first transistor having a control electrode for receiving a first input signal;
    a second transistor, responsive to the first input signal, coupled between the first power supply terminal and the input of the driver means;
    impedance means, coupled to the output terminal and the first for providing a resistance in parallel with the first resistor which is proportional to the voltage on the output terminal; and
    sensing means, coupled to the output terminal, for providing a sense signal at a voltage representative of the voltage on the output terminal; and
    a third transistor coupled in parallel with said second resistor and enabled by an enable signal.

2. The buffer circuit of claim 1, wherein the first resistor is characterized as having a first electrode and a second electrode and wherein the impedance means comprises:
    sensing means, coupled to the output terminal, for providing a sense signal at a voltage representative of the voltage on the output terminal; and
    a fourth transistor having a first current electrode coupled to the first electrode of the first resistor, a second current electrode coupled to the second electrode of the first resistor, and a control electrode for receiving the sense signal.

3. The buffer circuit of claim 2 wherein the driver means comprises a fifth transistor having a first current electrode coupled to the first power supply terminal, a second current electrode coupled to the output terminal, and a control electrode coupled to the series-coupled first transistor, first resistor, and second resistor.

4. The buffer circuit of claim 3 further comprising:
a sixth transistor having a first current electrode coupled to the second power supply terminal, a second current eletrode coupled to the output terminal, and a control electrode; and
a seventh transistor and a third resistor coupled in series between the second power supply terminal and the control electrode of the sixth transistor, said seventh transistor having a control electrode for receiving a second input signal.

5. A buffer circuit comprising:
driver means, coupled to an output terminal and having an input, for passing current between a first power supply terminal and the output terminal in proportion to a voltage level on said first input in order to change a voltage level on said output terminal;
a first transistor and a first resistor coupled in series between a second power supply terminal and the input of the driver means, said first transistor having a control electrode for receiving a first input signal and said first resistor characterized as having a first electrode and a second electrode;
a second transistor, responsive to the first input signal, coupled between the first power supply terminal and the input of the driver means;
sensing means, coupled to the output terminal, for providing a sense signal at a voltage representative of the voltage on the output terminal; and
a third transistor having a first current electrode coupled to the first electrode of the first resistor, a second current electrode coupled to the second electrode of the first resistor, and a control electrode for receiving the sense signal.

6. The buffer circuit of claim 1, wherein the sensing means comprises a fourth transistor having a first current electrode coupled to the output terminal a second current electrode coupled to the control electrode of the third transistor, and a control electrode for receiving an enable signal.

7. The buffer circuit of claim 1 wherein the driver means comprises a fourth transistor having a first current electrode coupled to the first power supply terminal, a second current electrode coupled to the output terminal, and a control electrode coupled to the series-coupled first transistor and first resistor.

8. The buffer circuit of claim 7, further comprising:
a fifth transistor having a first current electrode coupled to the second power supply terminal, a second current electrode coupled to the output terminal, and a control electrode;
a sixth transistor and a second resistor coupled in series between the second power supply terminal and the control electrode of the fifth transistor, said sixth having a control electrode for receiving a second input signal; and
a seventh transistor, responsive to the second input signal, coupled between the first power supply terminal and the control electrode of the fifth transistor.

9. The buffer of claim 1, wherein the sensing means comprises a eighth transistor having a first current electrode coupled to the output terminal, a second current electrode coupled to the control electrode of the third transistor, and a control electrode for receiving an enable signal.

10. The buffer circuit of claim 1 further comprising a second resistor, wherein said said series-coupled first transistor and first resistor are coupled to said power supply terminal via said second resistor which is interposed therebetween.

11. The buffer circuit of claim 10 further comprising a fourth transistor coupled in parallel with said second resistor and enabled by an enable signal.

12. In an integrated circuit comprising a package and a chip containing electrical circuits, the chip characterized as being contained in the package, the package characterized as having leads, wherein a first lead is connected to a first power supply terminal of the chip and a second lead is connected to a second power supply terminal of the chip, the first and second leads characterized as having inductance, a buffer circuit in the chip, comprising:
a first transistor having a first current electrode coupled to the first power supply terminal, a second current electrode for providing an output of the buffer circuit, and a control electrode;
a second transistor having a first current electrode coupled to the control electrode of the first transistor, a control electrode for receiving a first input signal, and a second current electrode;
a first resistor having a first electrode coupled to the second current electrode of the second transistor, and a second electrode coupled to the second power supply terminal;
a third transistor having a first current electrode coupled to the second current electrode of the first transistor, a control electrode for receiving an enable signal, and a second current electrode;
a fourth transistor having a first current electrode coupled to the first electrode of the first resistor, a second current electrode coupled to the second electrode of the first resistor, and a control electrode coupled to the second current electrode of the third transistor; and
a fifth transistor, responsive to the first input signal, coupled between the first power supply terminal and the input of the driver means.

13. The buffer of claim 8 further comprising a second resistor interposed between the first resistor and the second transistor, wherein the second resistor has a first electrode coupled to the first electrode of the first resistor, and a second electrode coupled to the second current electrode of the second transistor.

14. The buffer of claim 13 further comprising a sixth transistor having a first current electrode coupled to the first electrode of the second resistor, a second current electrode coupled to the second electrode of the second resistor, and a control electrode for receiving a second enable signal, said second enable signal delayed in time from said first enable signal.

* * * * *

UNITED STATES PATENT AND TRADEMARK OFFICE
CERTIFICATE OF CORRECTION

PATENT NO. : 4,800,298

DATED : January 24, 1989

INVENTOR(S) : Ruey J. Yu and Alan R. Bormann

It is certified that error appears in the above-identified patent and that said Letters Patent is hereby corrected as shown below:

```
Column 10, line 48, insert --resistor,-- between "first" and "for".
Column 11, line 43, change "1" to --5--.
Column 11, line 45, insert --,-- between "terminal" and "a".
Column 11, line 49, change "1" to --5--.
Column 12, line 3, change "1" to --8--.
Column 12, line 10, change "1" to --5--.
Column 12, line 53, change "8" to --12--.
```

Signed and Sealed this

Eighteenth Day of July, 1989

Attest:

DONALD J. QUIGG

Attesting Officer

Commissioner of Patents and Trademarks